(12) United States Patent
Montgomery et al.

(10) Patent No.: US 6,965,513 B2
(45) Date of Patent: *Nov. 15, 2005

(54) CARBON NANOTUBE THERMAL INTERFACE STRUCTURES

(75) Inventors: Stephen W. Montgomery, Federal Way, WA (US); Ven R. Holalkere, Dublin, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/027,442

(22) Filed: Dec. 20, 2001

(65) Prior Publication Data

US 2003/0117770 A1 Jun. 26, 2003

(51) Int. Cl.$^7$ ................................ G06F 1/20
(52) U.S. Cl. ................ 361/687; 361/704; 361/705
(58) Field of Search .................. 361/687, 704–708, 361/717, 718, 722; 428/408, 216, 228; 165/80.2, 185

(56) References Cited

U.S. PATENT DOCUMENTS

| | | | |
|---|---|---|---|
| 5,753,088 A | 5/1998 | Olk | 204/173 |
| 5,965,267 A | 10/1999 | Nolan et al. | 428/408 |
| 6,006,168 A * | 12/1999 | Schumann et al. | 702/132 |
| 6,203,814 B1 | 3/2001 | Fisher et al. | 424/443 |
| 6,232,706 B1 | 5/2001 | Dai et al. | 313/309 |
| 6,256,996 B1 | 7/2001 | Ghoshal | 62/3.7 |
| 6,407,922 B1 * | 6/2002 | Eckblad et al. | 361/704 |
| 2002/0090501 A1 * | 7/2002 | Tobita | 428/297.4 |
| 2002/0145194 A1 * | 10/2002 | O'Connor et al. | 257/712 |

FOREIGN PATENT DOCUMENTS

| | | | |
|---|---|---|---|
| EP | 1054036 | 11/2000 | C08K/7/24 |
| EP | 1109218 | 6/2001 | H01L/23/373 |
| WO | WO-00/33628 | 6/2000 | H05K/7/20 |
| WO | WO-01/30694 | 5/2001 | C01B/31/02 |
| WO | WO-01/92381 | 12/2001 | C08J/5/04 |

OTHER PUBLICATIONS

Andrews, R., et al., "Nanotube Composite Carbon Fibers", *Applied Physics Letters*, 75, (Aug. 30, 1999), 1329–1331.

Mathis, Nancy, et al., "Thermal Conductivity of Thin Film Carbon Fiber Die Attach", *RETEC'98 Proceedings*, (1998), 1–10.

* cited by examiner

*Primary Examiner*—Yean-Hsi Chang
(74) *Attorney, Agent, or Firm*—Schwegman, Lundberg, Woessner & Kluth, P.A.

(57) ABSTRACT

The invention relates to a process of forming a thermal interface that employs carbon nanotubes to reduce thermal resistance between an electronic device and a cooling solution. Bundles of aligned nanotubes receive injected polymeric material to produce a polymeric/carbon composite which is then placed between the electronic device and a heat sink or other cooling solution.

26 Claims, 3 Drawing Sheets

CARBON NANOTUBE THERMAL INTERFACE STRUCTURES

FIELD OF THE INVENTION

The present invention relates generally to providing cooling solutions to electronic circuits, and, more specifically to the fabrication of a thermal interface structure using carbon nanotubes to improve thermal performance to a die containing an electronic circuit.

BRIEF DESCRIPTION OF THE DRAWINGS

In order that the manner in which the embodiments of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The present invention relates to a thermal interface structure and method of forming it from a matrix of oriented carbon nanotubes projecting from a substrate.

It will be readily understood to those skilled in the art that various other changes in the details, material, and arrangements of the parts and method stages which have been described and illustrated in order to explain the nature of this invention may be made without departing from the principles and scope of the invention as expressed in the claims.

Figure 1:
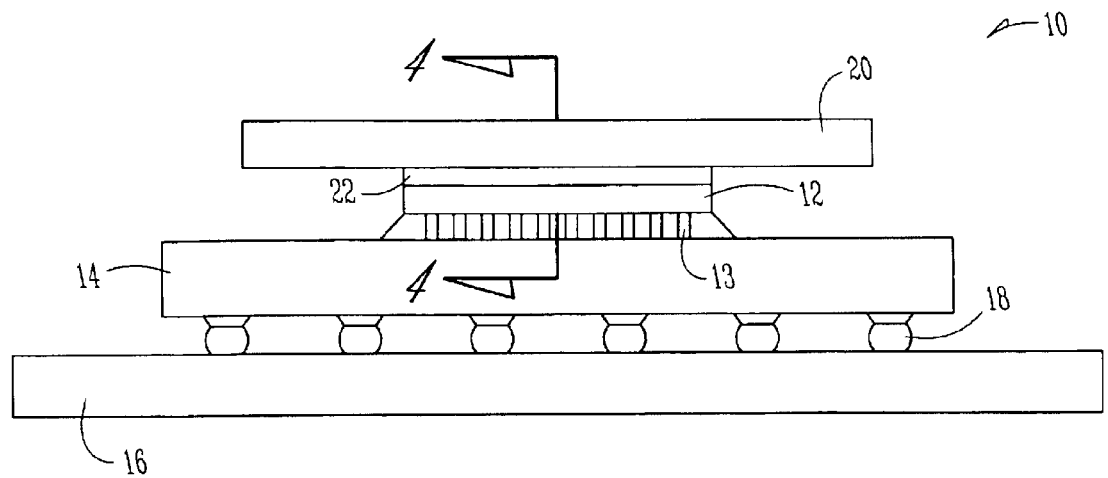
FIG. 1 is an elevation view of a flip chip electronic device which is coupled to a cooling plate using a thermal interface according to an embodiment of the present invention.

In FIG. 1, a portion of an electronic device such as a computer 10 is illustrated in an elevation view. In device 10, a silicon die 12 which, in the embodiment shown, is mounted in a flip-chip ball grid array on an organic substrate 14 which is, in turn, mounted on a further substrate 16 and secured by solder balls 18. A cooling solution such as heat sink plate 20 is coupled to the surface of die 12 by a thermal interface structure 22 in the embodiment shown.

A variety of thermal interface materials have been used in the past to reduce thermal resistance between a die and a cooling solution. In some applications, thermal grease is used for the thermal interface material since such materials have high bulk thermal conductivity and readily conform to surface irregularities in the heat sink and the device. Use of thermal greases, however, have the disadvantage of possible pump out and phase separation of the grease as the die is heated and undergoes thermal warping due to differences in the coefficient of thermal expansion between die 12 and organic substrate 14. In other applications, adhesives such as epoxy are used as thermal interface material but have the disadvantage of requiring a cure process after their application. Various thermal gels such as silicones or certain olefins may also be used as thermal interface materials but they also require curing after application and have lower thermal conductivity than thermal grease. Certain elastomers such as urethane rubber have high bulk conductivity but suffer from high contact resistance and require that high pressure of at least 100 psi be applied at the thermal junction to provide adequate thermal coupling. Finally, certain phase change materials such as low molecular weight polyesters have been used but also suffer from the fact that their thermal conductivity is less than that of thermal grease. The thermal conductivity of thermal interface materials commonly used have a conductivity value of about 10 W/m-° K.

In one embodiment of the invention, a thermal interface structure is formed from an array of aligned carbon nanotubes in a polymeric interstitial material. Since the thermal conductivity of the carbon nanotubes is on the order of 3000 W/m-° K using them in a thermal interface structure will substantially increase its thermal conductivity.

Figure 2:
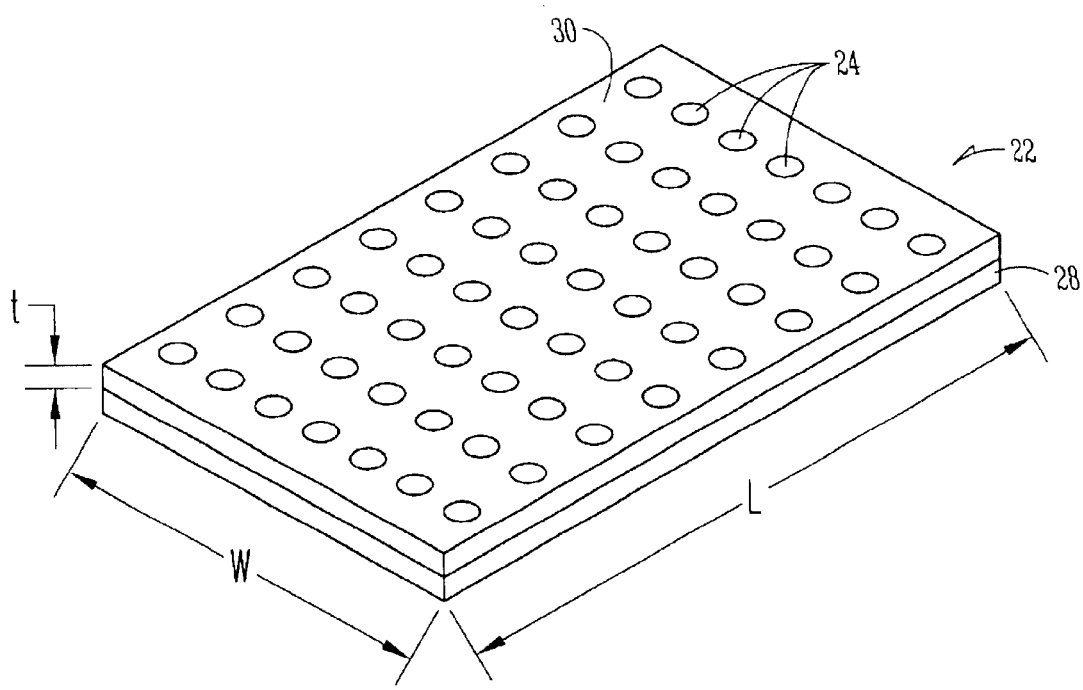
FIG. 2 is a perspective view of a portion of the thermal interface of FIG. 1, with polymer additive, showing carbon nanotube array bundles.
Figure 3:
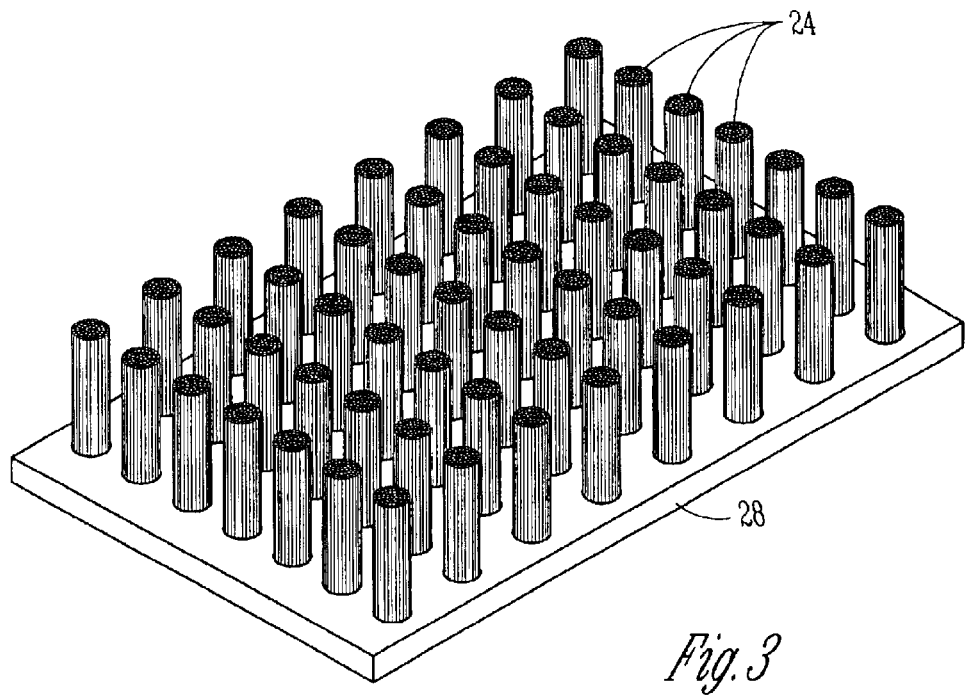
FIG. 3 is a perspective illustrational schematic view of a thermal interface showing, carbon nanotube bundles, in exaggerated scale distributed over the surface of the thermal interface.

In FIG. 2, a portion of a substrate 28 having an array of spaced bundles 24 of carbon nanotubes 26 projecting from the surface thereof is illustrated in highly enlarged form prior to injection of a polymer additive. Such arrays are available from Nano-Lab, Inc. which manufactures them under a chemical vapor deposition process described in an article of Dr. Z. F. Ren in *Science*, 282, 1105 (1998). The array of bundles 24 of nanotubes 26 which are produced in accordance with the process are grown on a variety of substrates 28 including glass and silicon. The nanotubes 26 grown on substrate 28 are aligned so that the majority of the nanotubes are oriented generally parallel to each other and perpendicular to the substrate 28 from which they project. The heights of the nanotubes are typically quite similar.

A thermal interface structure 22 according to the present invention may be formed from a substrate 28 upon which nanotube bundles 26 are supported. A polymeric interstitial material 30 is injected around the nanotube bundles 26 to support the nanotubes. Suitable polymeric materials include polycarbonate, polypropylene and acetal. After addition of polymeric material 30, the substrate 28 upon which the nanotubes were originally formed is removed. Suitable processes for removal of substrate 28 are mechanical grinding or chemical etching.

As shown in FIG. 2, the length L and width W of thermal interface structure 22 are selected to provide a substantial heat exchange surface while falling within the outlines of the exposed surface of die 12. In one embodiment the length and width are 2 cm and 1 cm.

Figure 4:
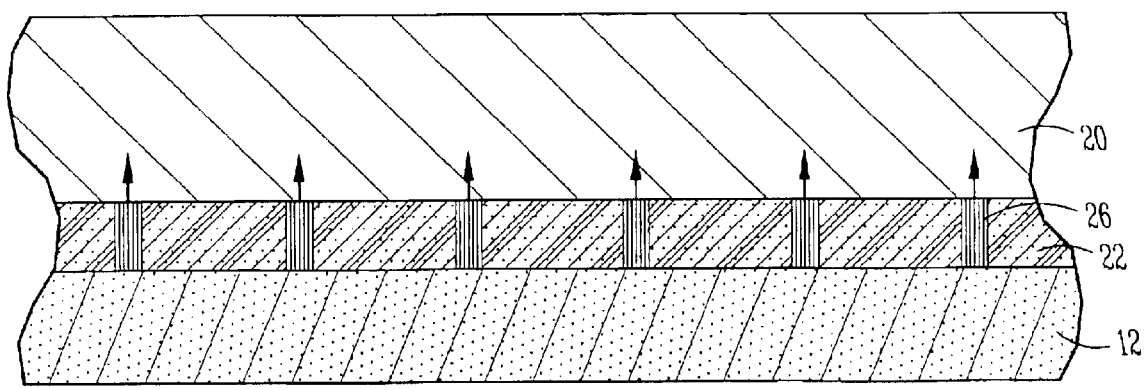
FIG. 4 is an elevational cross-section of the thermal interface structure depicted in FIG. 3 showing the flow of heat from the surface of the electronic device to the heat sink.

The maximum thickness t of the thermal interface structure is limited by the length of the carbon nanotubes but will typically fall within the range of about 5 to 20 microns. Of course, increasing the thickness of the thermal interface structure 22 will increase the thermal impedance of the path between the die and the heat sink. As shown in FIG. 4, the carbon nanotubes are oriented generally parallel to each other and perpendicular to the top and bottom surfaces of structure 22, since they provide their greatest thermal conductivity along their longitudinal axes and it is desirable to have the conducted heat follow the shortest path between die 12 and heat sink 20.

Figure 5:
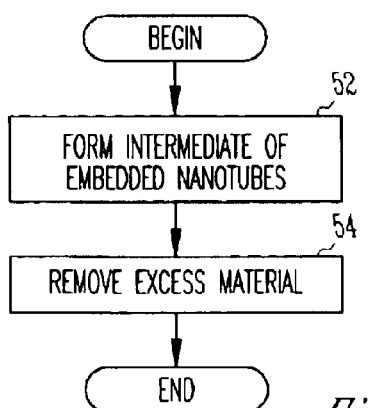
FIG. 5 is a flow chart of a process for producing a thermal interface structure according to one embodiment of the present invention.

FIG. 5 is a flow chart outlining an embodiment of the method of forming the thermal intermediate structure. In operation 52 an array 24 of nanotube bundles 26 includes a substrate 28 from which nanotubes 26 project. The array is embedded with an interstitial material 30 which is a polymeric material selected from the group consisting of polycarbonate, polypropylene, polyacetal, polyoxymethylene and polyformaldehyde. The interstitial material 30 is thermoplastic and is injected in molten form to embed it in the array to form an intermediate structure.

In operation 54 any excess interstitial material 30 is removed from the intermediate and the substrate 28 upon which the nanotube bundles were originally grown. The removal can be performed by a chemical mechanical polishing process or by mechanical grinding. At the conclusion of operation 54, the thermal intermediate structure is completed. The carbon nanotubes remained aligned with each other throughout the forming of the structure and, after removal of excess interstitial material and the original substrate, the ends of the carbon nanotubes are at the surfaces of the thermal intermediate structure which engage the object to be cooled and the cooling solution surface to which the thermal intermediate structure couples it.

If the thermal intermediate structure provides thermal coupling between surfaces of two objects and the thermal intermediate structure is under pressure, yielding of the interstitial material will assure that the carbon nanotubes make secure thermal contacts with the surfaces of the objects which sandwich it, despite the presence of irregularities in the flatness of the surfaces.

Figure 6:
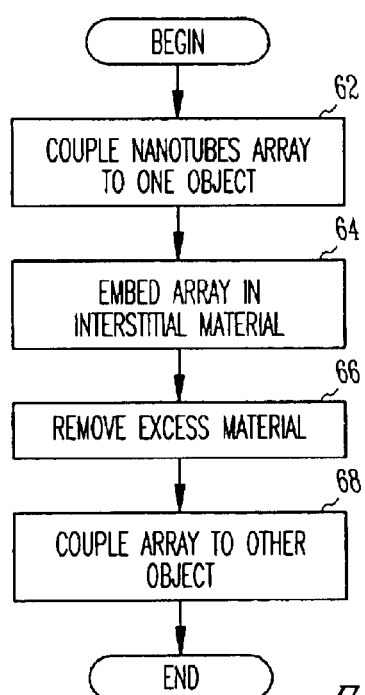
FIG. 6 is a flow chart of a process for providing a thermal path between two objects according to an embodiment of the present invention.

FIG. 6 shows a process for providing a thermal coupling between two objects. In operation 62, a nanotube array is coupled to one of the objects. In one embodiment, the nanotube array may actually be grown on the surface of the object rather than on a separate substrate. In that embodiment it is necessary that the temperatures and other conditions under which the carbon nanotubes are formed by within the temperature ranges and exposure times permitted by the object upon which the nanotube array is grown. In this embodiment the injection with the interstitial material in operation 64 and the removal of the excess material are carried out in much the same manner of the operations shown in FIG. 5.

In another embodiment, operation 62 is performed after the nanotubes are formed on a separate substrate and after the interstitial material has been applied in operation 64 and the excess material removed in operation 66.

In the embodiments the process shown in FIG. 6 discussed above, the operation 68 involves coupling the other surface of the array to the other of the two objects. In one embodiment one of the objects may be a cooling solution such as a heat sink and the other a semiconductor die. In one embodiment, either of the objects can receive carbon nanotubes as they are grown in operation 62. Using that process, an additional advantage of a particularly strong thermal bond to that object is obtainable.

Figure 7:
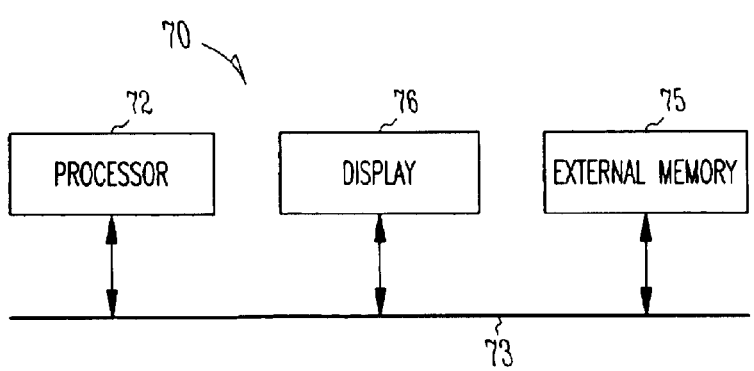
FIG. 7 is a block diagram of an electronic system incorporating at least one electronic assembly with a carbon nanotube thermal structure according to one embodiment of the invention.

FIG. 7 is a block diagram of an electronic system 70 incorporating at least one electronic assembly 72 with a thermally conductive element between a first surface of an integrated circuit die and a heat sink, in accordance with one embodiment of the invention. Electronic system 70 is merely one example of an electronic system in which the present invention can be used. In this example, electronic system 70 comprises a data processing system that includes a system bus 73 to couple the various components of the system. System bus 73 provides communications links among the various components of the electronic system 70 and can be implemented as a single bus, as a combination of busses, or in any other suitable manner.

Electronic assembly 74 is coupled to system bus 73. Electronic assembly 72 can include any circuit or combination of circuits. In one embodiment, electronic assembly 4 includes a processor 74 which can be of any type. The IC or ICs within electronic assembly 4 can perform any other type of function.

Electronic system 70 can also include an external memory 75, which in turn can include one or more memory elements suitable to the particular application.

Electronic system 70 can also include a display device 76 or any other device that permits a system user to input information into and receive information from the electronic system 70.

The foregoing description of the specific embodiments reveals the general nature of the invention sufficiently that others can, by applying current knowledge, readily modify and/or adapt it for various applications without departing from the generic concept and therefore such adaptations and modifications are intended to be comprehended within the meaning and range of equivalents of the disclosed embodiments.

It is to be understood that the phraseology and terminology employed herein is for the purpose of description and not of limitation. Accordingly, the invention is intended to embrace all such alternatives, modifications, equivalents and variations as fall within the spirit and broad scope of the appended claims.

What is claimed is:

1. A thermal interface structure comprising:
   at least one carbon nanotube bundle oriented substantially parallel to a desired heat transfer axis of the thermal interface; and
   an interstitial material in which the nanotube bundles are embedded.

2. The structure of claim 1, wherein the structure has a first surface to contact a surface of a circuit die and a second surface to contact a surface of a cooling solution, the first and second surfaces being substantially parallel to each other.

3. The structure of claim 2, wherein the thickness of the structure from the first surface to the second surface is about 5 to 20 microns.

4. The structure of claim 1 wherein the interstitial material is a polymeric material.

5. The structure of claim 4, wherein the polymeric material is selected from the group consisting of polycarbonate, polypropylene, polyacetal, polyoxymethylene and polyformaldehyde.

6. A thermal interface comprising:
   at least one bundle of carbon nanotubes, the bundles oriented substantially parallel to each other and to a heat transfer flow path of the thermal interface; and
   an interstitial material between the bundles of nanotubes.

7. The thermal interface of claim 6 wherein the interstitial material is a polymeric material.

8. The thermal interface of claim 6 wherein the thermal interface has first and second generally planar surfaces which are each substantially perpendicular to the heat transfer path.

9. A heat transfer structure for use with a semiconductor die comprising:
   a heat sink having a surface to couple to the die; and
   a thermally conductive element comprising a first surface coupled to the heat sink and a second surface coupled to the semiconductor die, the thermally conductive element comprising a plurality of bundles of carbon nanotubes oriented with their axes substantially perpendicular to the first and second surfaces.

10. The heat transfer structure of claim 9 wherein the thermally conductive element also comprises an interstitial bonding material interspersed among the bundles of carbon nanotubes.

11. The heat dissipating structure of claim 10 wherein the interstitial bonding material is a polymeric material selected from the group consisting of polycarbonate, polypropylene, polyacetal, polyoxymethylene and polyformaldehyde.

12. The heat dissipating structure of claim 9 wherein the thermally conductive element has a surface area that is substantially the same as the surface area of the die.

13. The heat dissipating structure of claim 12 wherein the thickness of the thermally conductive element is between 10 and 50 microns.

14. An electronic assembly comprising at least one integrated circuit package comprising:
   at least one integrated circuit die;
   a heat sink having a surface coupled to the die; and
   a thermally conductive element comprising a first surface coupled to the heat sink and a second surface coupled to the die, the thermally conductive element comprising a plurality of bundles of carbon nanotubes oriented with their axes substantially perpendicular to the first and second surfaces.

15. The electronic assembly of claim 14 wherein the thermally conductive element also comprises an interstitial material embedded among the bundles of carbon nanotubes.

16. The electronic assembly of claim 15 wherein the interstitial material is a polymeric material selected from the group consisting of polycarbonate, polypropylene, polyacetal, polyoxymethylene and polyformaldehyde.

17. A data processing system comprising:
   a bus coupling components to the data processing system;
   a display coupled to the bus;
   external memory coupled to the bus; and
   a processor coupled to the bus and comprising an electronic assembly including at least one electronic package comprising:
   at least one integrated circuit die;
   a heat sink having a surface coupled to the die; and
   a thermally conductive element comprising a first surface coupled to the heat sink and a second surface to couple to the die, the thermally conductive element comprising a plurality of bundles of carbon nanotubes oriented with their axes substantially perpendicular to the first and second surfaces.

18. The data processing system of claim 17 wherein the thermally conductive element comprises an interstitial material interspersed among the bundles of carbon nanotubes.

19. The data processing system of claim 18 wherein the interstitial material is a polymeric material selected from the group consisting of polycarbonate, polypropylene, polyacetal, polyoxymethylene and polyformaldehyde.

20. A method of fabricating a thermal interface structure comprising:
   embedding an array of bundles of substantially aligned carbon nanotubes in an interstitial material to form an intermediate having a layer of substantially aligned carbon nanotubes embedded therein; and
   removing excess material from the intermediate to provide a thermal interface structure having a first substantially planar surface for engaging a surface of one object and a second substantially planar surface for engaging a surface of another object, the first and second surfaces oriented substantially perpendicular to the substantially aligned carbon nanotubes.

21. The method of claim 20 wherein the array of bundles of substantially aligned carbon nanotubes also comprises a substrate from which the carbon nanotubes project and wherein the removing of excess material also comprises removing at least a portion of the substrate.

22. The method of claim 20 wherein removing excess material comprises chemical mechanical polishing of the intermediate.

23. The method of claim 20 wherein removing excess material comprises etching the intermediate.

24. A method of providing a thermal intermediate between two objects comprising:
   providing an array of bundles of substantially aligned carbon nanotubes coupled to one of the objects;
   embedding the array of bundles of substantially aligned carbon nanotubes in an interstitial material to form a layer of substantially aligned carbon nanotubes embedded therein; and
   coupling the array to the other object.

25. The method of claim 24 wherein providing the array coupled to the object comprises forming the bundles of carbon nanotubes on the surface of the object.

26. The method of claim 24 wherein providing the array coupled to the object comprises
   forming the array on a substrate;
   embedding the array in an interstitial material;
   removing the substrate; and
   coupling the array to the object.

* * * * *

UNITED STATES PATENT AND TRADEMARK OFFICE
CERTIFICATE OF CORRECTION

| | | |
|---|---|---|
| PATENT NO. | : 6,965,513 B2 | Page 1 of 1 |
| APPLICATION NO. | : 10/027442 | |
| DATED | : November 15, 2005 | |
| INVENTOR(S) | : Montgomery et al. | |

It is certified that error appears in the above-identified patent and that said Letters Patent is hereby corrected as shown below:

In Column 4, line 44, in Claim 1, delete "at least one carbon nanotube bundle" and insert -- a plurality of carbon nanotube bundles --, therefor.

Signed and Sealed this

Nineteenth Day of September, 2006

JON W. DUDAS
*Director of the United States Patent and Trademark Office*